United States Patent
Teshima et al.

(10) Patent No.: US 9,894,819 B2
(45) Date of Patent: Feb. 13, 2018

(54) SUCTION NOZZLE FOR MOUNTING ELECTRONIC COMPONENTS

(71) Applicant: FUJI MACHINE MFG. CO., LTD., Chiryu (JP)

(72) Inventors: Chikashi Teshima, Okazaki (JP); Kenzo Ishikawa, Kariya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/110,676

(22) PCT Filed: Jan. 22, 2014

(86) PCT No.: PCT/JP2014/051279
§ 371 (c)(1),
(2) Date: Jul. 8, 2016

(87) PCT Pub. No.: WO2015/111156
PCT Pub. Date: Jul. 30, 2015

(65) Prior Publication Data
US 2016/0353620 A1    Dec. 1, 2016

(51) Int. Cl.
*H05K 13/04* (2006.01)
*B25J 15/06* (2006.01)

(52) U.S. Cl.
CPC ...... *H05K 13/0408* (2013.01); *B25J 15/0616* (2013.01)

(58) Field of Classification Search
CPC ... G01N 19/00; B25J 15/0641; B25J 15/0616; H05K 13/0413; H05K 13/0408; H01L 21/6838; B66C 1/02
See application file for complete search history.

(56) References Cited

U.S. PATENT DOCUMENTS

| | | | | |
|---|---|---|---|---|
| 5,707,093 A * | 1/1998 | Nagai | ............ | B65G 47/91 29/743 |
| 6,000,122 A * | 12/1999 | Uchida | ............ | H05K 13/0408 29/740 |
| 6,748,649 B2 * | 6/2004 | Okuda | ............ | H05K 13/0413 29/721 |
| 6,851,733 B2 * | 2/2005 | Mori | ............ | B65G 47/91 29/743 |
| 2007/0289125 A1 * | 12/2007 | Uchida | ............ | H05K 13/0408 29/743 |

FOREIGN PATENT DOCUMENTS

JP    2013-49097 A    3/2013

OTHER PUBLICATIONS

International Search Report dated Mar. 11, 2014 for PCT/JP2014/051279 filed on Jan. 22, 2014.
Extended European Search Report dated Sep. 14, 2017 in Patent Application No. 14879946.3.

* cited by examiner

*Primary Examiner* — Stephen A Vu
(74) *Attorney, Agent, or Firm* — Oblon, McClelland, Maier & Neustadt, L.L.P.

(57) ABSTRACT

A suction nozzle, including a suction assistance section provided within an intake passage and connecting a side downstream of a pin and a side upstream of the pin, is provided. A cross section (the area of a cross section cut in a direction perpendicular to the direction in which the intake passage extends) of the intake passage is narrowed by the pin. Air bypasses the pin by flowing through the suction assistance section.

7 Claims, 6 Drawing Sheets

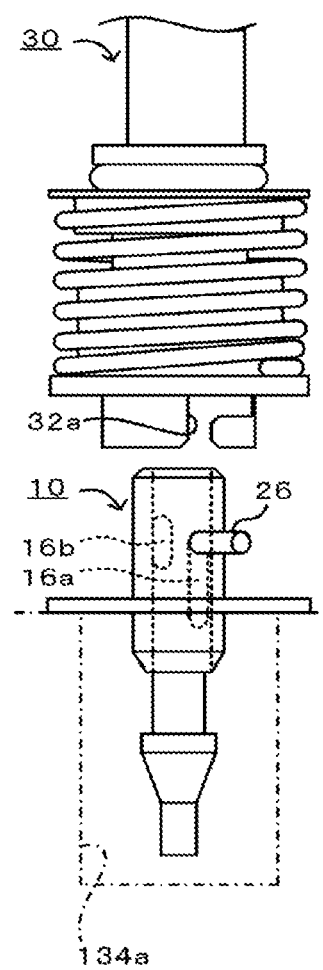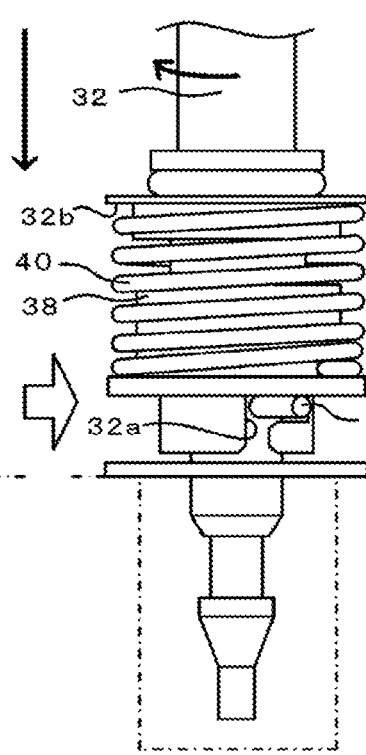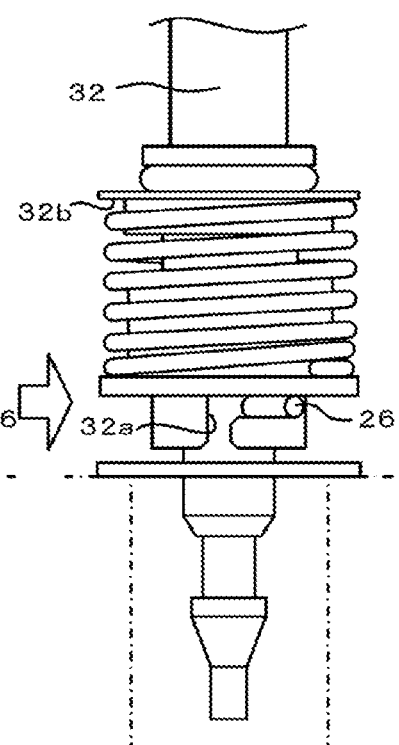

SUCTION NOZZLE FOR MOUNTING ELECTRONIC COMPONENTS

TECHNICAL FIELD

The present disclosure relates to a suction nozzle for mounting electronic components that picks up an electronic component at its tip.

BACKGROUND ART

Suction nozzles for mounting electronic components that pick up an electronic component at the tip of the suction nozzle are known. For example, suction nozzle 200 shown in FIG. 7 of patent literature 1 is provided with nozzle main body 202 that includes walls surrounding intake passage 210, sleeve 204 that stores nozzle main body 202 so as to be slidable along the direction in which intake passage 210 extends, a pair of elongated holes provided in nozzle main body 202 along the direction in which intake passage 210 extends, and pin 208 that cuts across intake passage 210 and is inserted into the pair of elongated holes 206. Pin 208 is fixed to sleeve 204 and both ends of pin 208 protrude outside sleeve 204. The protruding ends are used when making the suction nozzle a single integrated body with a nozzle holder. With this suction nozzle 200, when nozzle main body 202 is slid with respect to sleeve 204 along the direction in which intake passage 210 extends, nozzle main body 202 is slid being guided by pin 208 being inserted into the pair of elongated holes 206.

CITATION LIST

Patent Literature

Patent Literature 1: JP-A-2013-49097

SUMMARY

The size of suction nozzles such as suction nozzle 200 is becoming smaller in recent years as the sizes of the electronic components to be picked up at the tip of the suction nozzle become smaller. For example, there are known suction nozzles for which the internal diameter of intake passage 210 and the diameter of pin 208 are around 1 mm. As the size becomes smaller in this way, there are cases in which the proportion of the cross section of intake passage 210 (the area of a cross section cut in a direction perpendicular to the direction in which the intake passage extends) occupied by the cross section of pin 208 that cuts across intake passage 210 becomes larger (refer to FIG. 8) such that the negative pressure applied in intake passage 210 cannot be maintained. For example, for components for which the surface, at which suction nozzle 200 picks up the component, is curved, such as large capacity capacitors, leaks occur easily, thus there are cases in which the negative pressure applied in intake passage 210 cannot be maintained, meaning the orientation of the component after pickup may be disturbed, resulting in not being able to mount the component on a board with good accuracy.

The present disclosure takes account of such problems and an object thereof is to provide a suction nozzle for mounting electronic components provided with an intake passage and a pin that cuts across the intake passage, such that negative pressure can be sufficiently applied to the intake passage.

The present disclosure of a suction nozzle for mounting an electronic component is provided with an intake passage in which negative pressure is applied such that an electronic component is picked up at a tip of the suction nozzle; a pin that cuts across the intake passage; and a suction assistance section provided in a wall surrounding the intake passage and connecting a downstream side of the pin and an upstream side of the pin within the intake passage.

Effects

With this suction nozzle for mounting an electronic component, the suction assistance section is provided within the intake passage and connects a side downstream of the pin and a side upstream of the pin. A cross section (the area of a cross section cut in a direction perpendicular to the direction in which the intake passage extends) of the intake passage is narrowed by the pin. However, air is able to bypass the pin by flowing through the suction assistance section. Accordingly, a sufficient flow amount is maintained even in the portion of the intake passage where the pin cuts across. As a result, sufficiently large negative pressure is applied in the intake passage.

With a suction nozzle for mounting an electronic component according to the present disclosure, the pin may pierce a wall surrounding the intake passage such that an end of the pin protrudes outside, and the protruding tip of the pin may be used when integrating the suction nozzle with a nozzle holder. In this case, a relatively large force is applied to the tip of the pin, but because the pin pierces the wall surrounding the intake passage, compared to a case in which the pin is joined to an outer surface of the wall, the strength is better and the risk of breaking is small. Note that, both ends of the pin may protrude to the outside, or one end of the pin may protrude to the outside.

A suction nozzle for mounting an electronic component according to the present disclosure may further include a nozzle main body including the wall that surrounds the intake passage, a sleeve that stores the nozzle main body so as to be slidable along a direction in which the intake passage extends, and a pair of elongated holes provided in the nozzle main body along the direction in which the intake passage extends, wherein the pin is fixed to the sleeve, cuts across the intake passage, and is inserted into the pair of elongated holes. According to this, when the nozzle main body is slid with respect to the sleeve along the direction in which the intake passage extends, the nozzle main body is slid being guided by the pin being inserted into the pair of elongated holes, thus there is no shifting of the sliding direction.

For a suction nozzle for mounting an electronic component according to the present disclosure provided with a nozzle main body, a sleeve, and a pair of elongated holes, the suction assistance section may be a hole provided in the nozzle main body along the direction in which the intake passage extends different to the pair of elongated holes. According to this, to provide the suction assistance section, all that is required is a hole in the nozzle main body, thus manufacturing is easy compared to a case in which a groove is provided in the nozzle main body as the suction assistance section.

For a suction nozzle for mounting an electronic component according to the present disclosure provided with a nozzle main body, a sleeve, and a pair of elongated holes, the suction assistance section may be provided as a pair in the nozzle main body, and, when looking at a cross section of the intake passage at a section where the pin cuts across the intake passage in a direction perpendicular to the direction in which the intake passage extends, the pair of elongated holes may have two-way symmetry about the center axis line of the intake passage, and the pair of suction assistance sections may be provided at positions rotated by 90 degrees from the pair of elongated holes about the center axis line of the intake passage. According to this, because the pair of suction assistance sections are formed in a well-balanced manner with the pair of elongated holes, the strength of the nozzle main body is higher compared to a case in which the pair of suction assistance sections are formed in a lop-sided manner.

BRIEF DESCRIPTION OF DRAWINGS

FIG. 6 shows the attachment procedure for suction nozzle 10.

DESCRIPTION OF EMBODIMENTS

Figure 1:
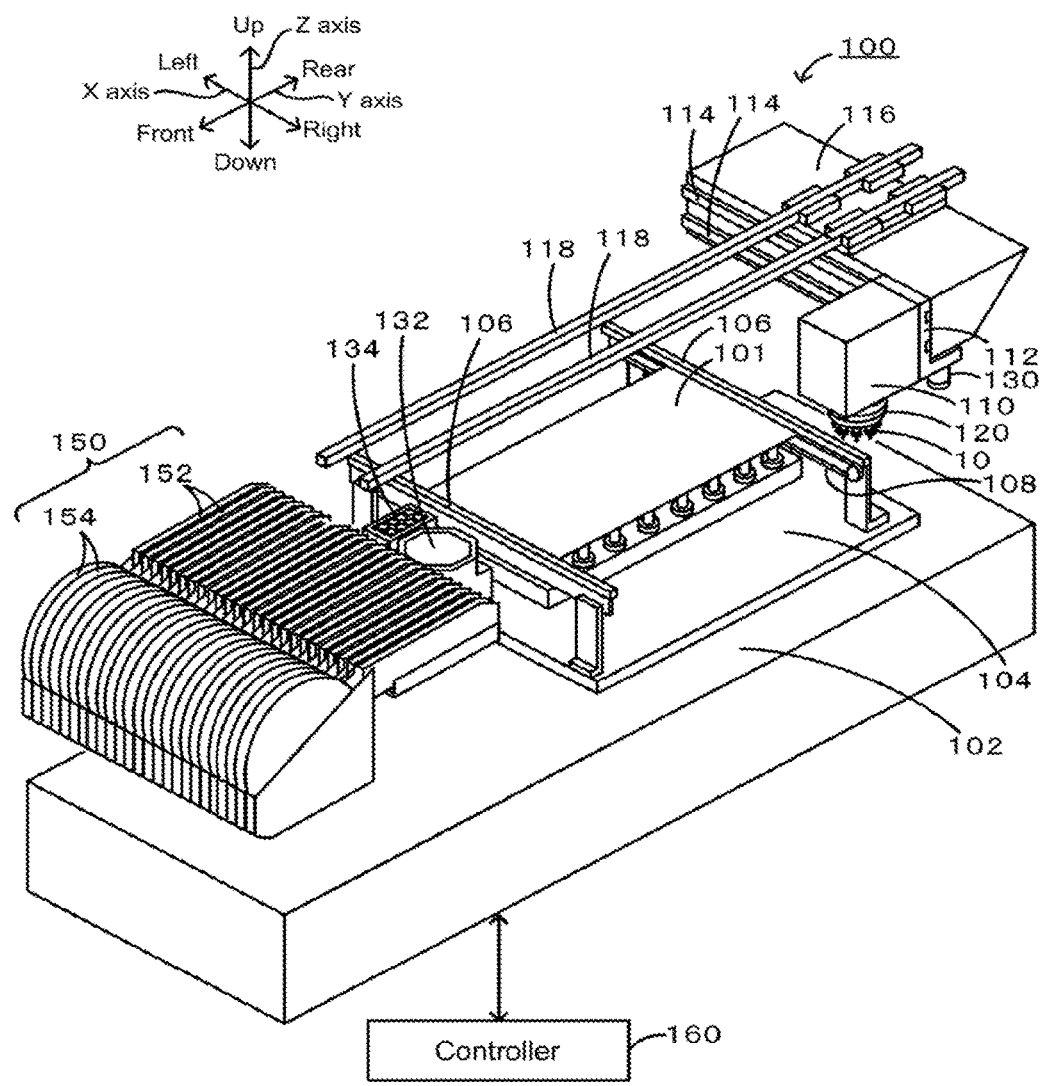
FIG. 1 shows the overall configuration of component mounting device 100.
Figure 2:
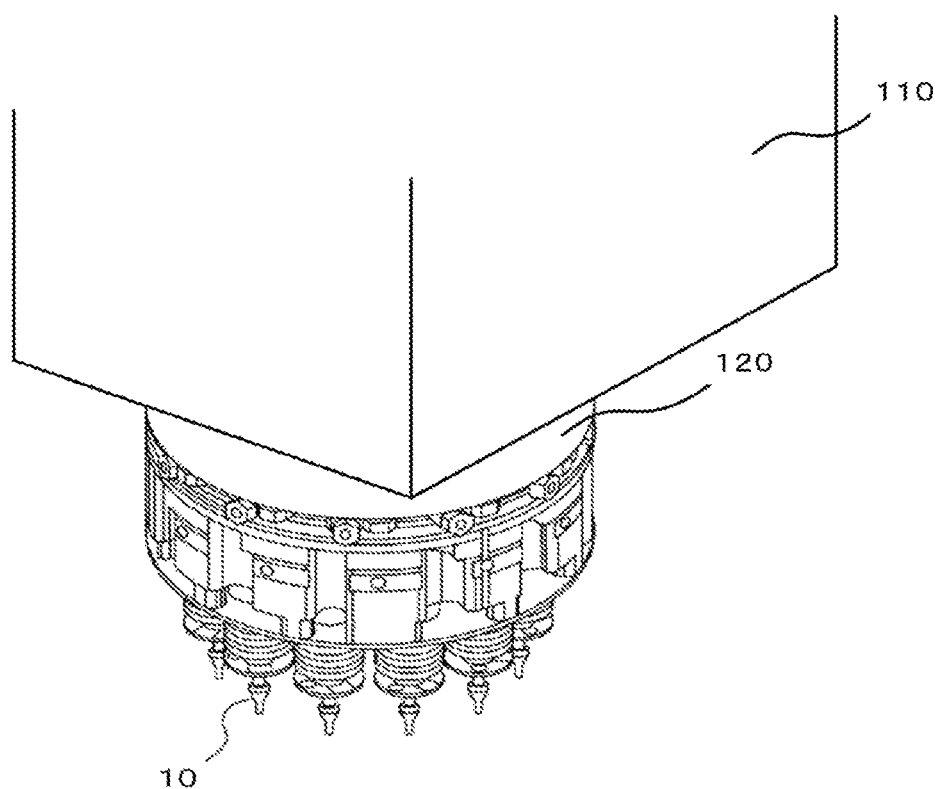
FIG. 2 is a perspective view of head unit 110.
Figure 3:
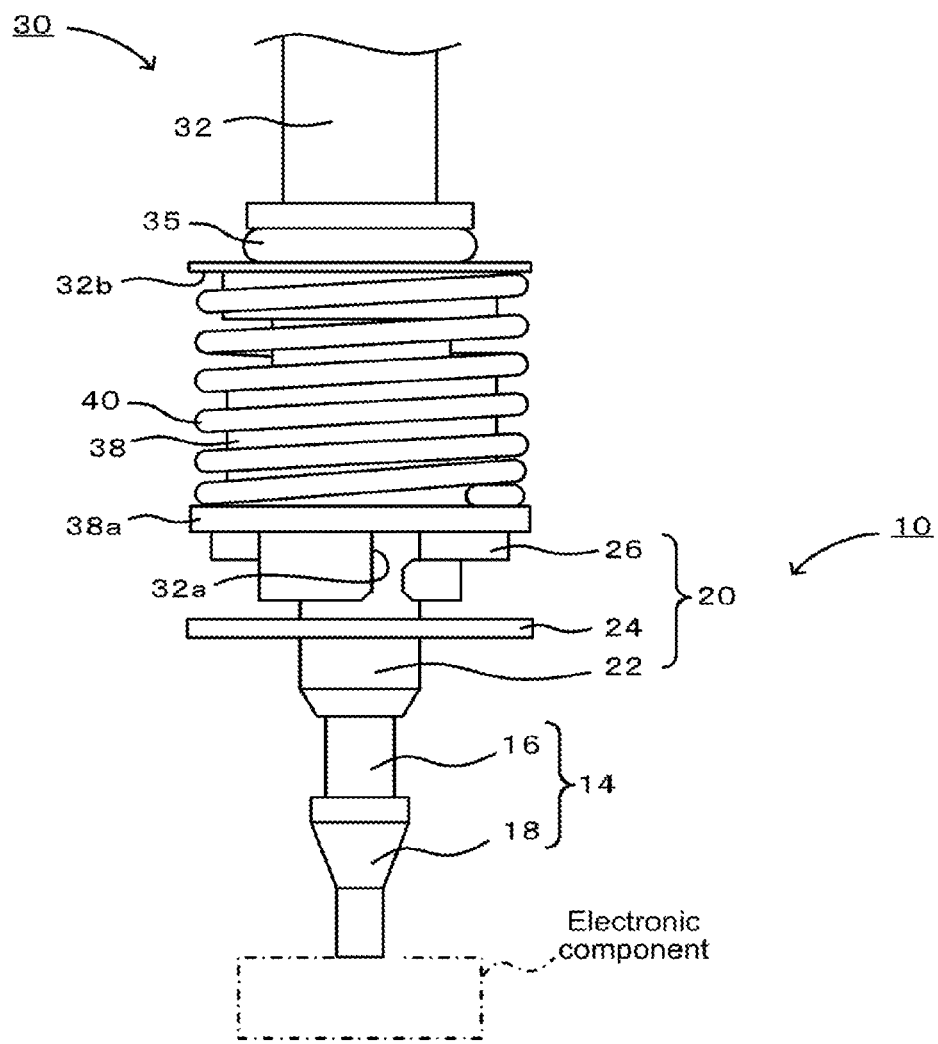
FIG. 3 is a front view of suction nozzle 10.
Figure 4:
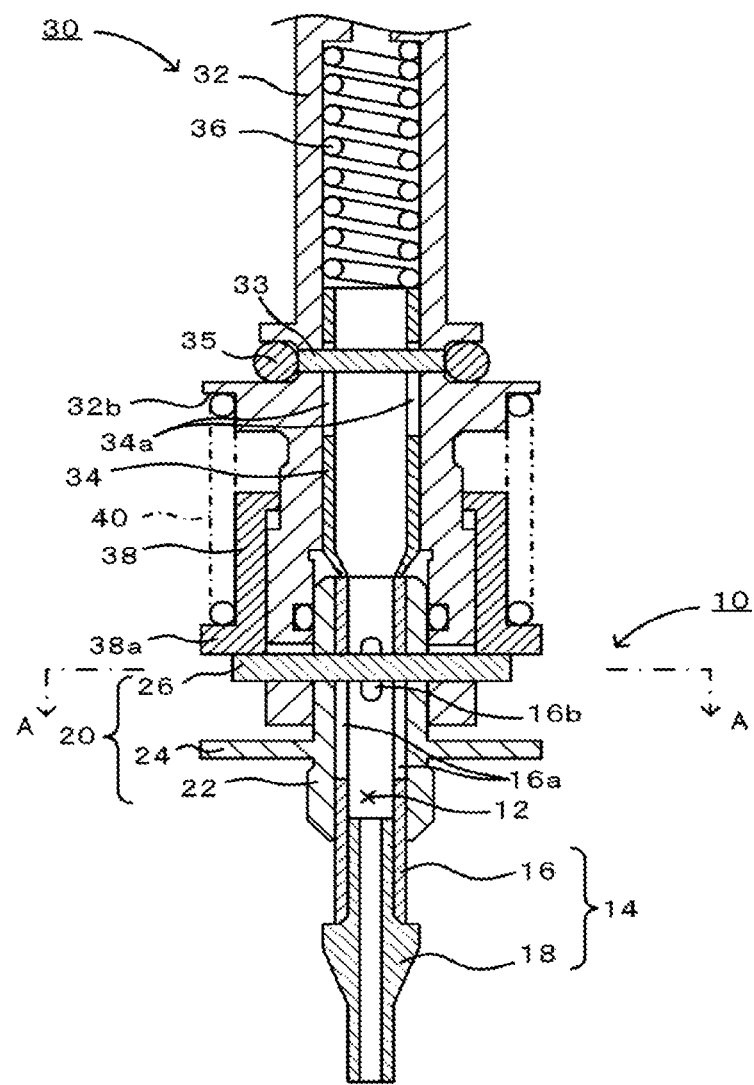
FIG. 4 is a cross section of suction nozzle 10.
Figure 5:
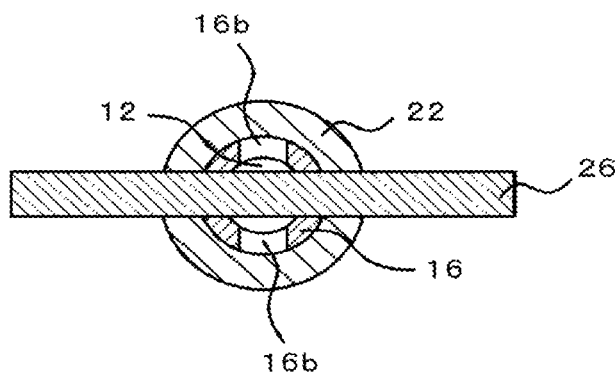
FIG. 5 is a cross section of A-A in FIG. 4.
Figure 7:
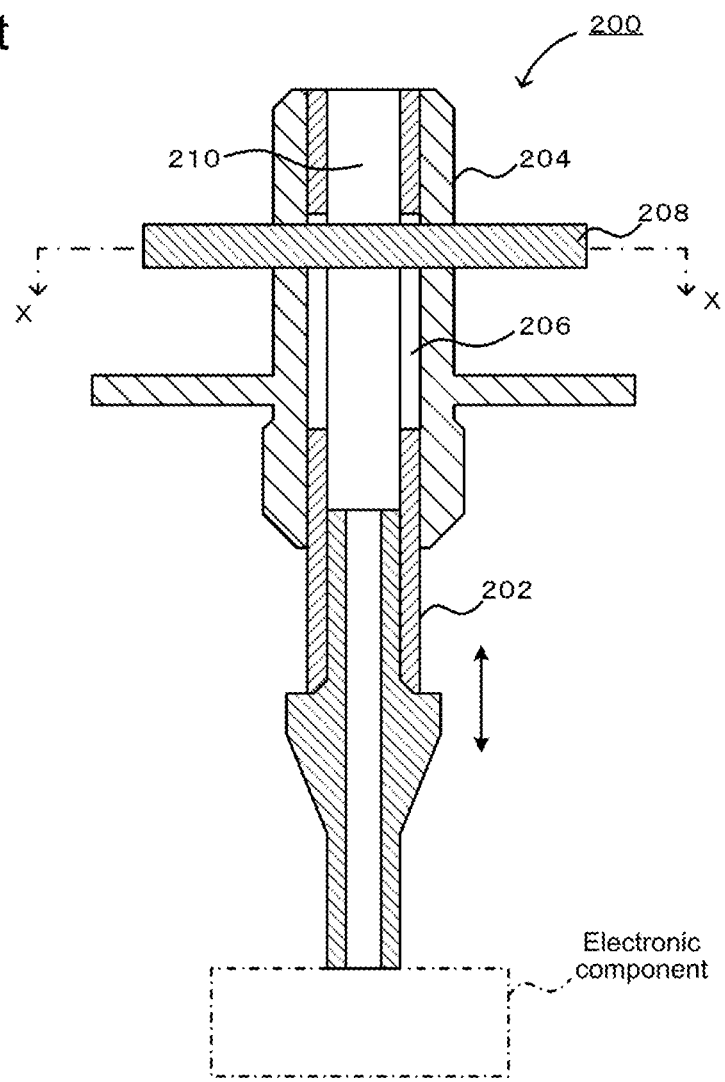
FIG. 7 is a cross section of conventional suction nozzle 200.
Figure 8:
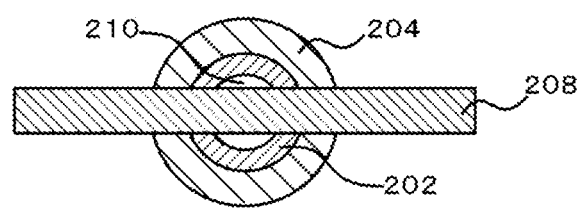
FIG. 8 is a cross section of X-X in FIG. 7.

Hereinafter, a suitable embodiment of the present disclosure is described with reference to the figures. FIG. 1 shows the overall configuration of component mounting device 100, and FIG. 2 shows a perspective view of head unit 110. FIGS. 3 to 5 show suction nozzle 10; FIG. 3 is a front view, FIG. 4 is a cross section, and FIG. 5 is a cross section of A-A from FIG. 4.

As shown in FIG. 1, component mounting device 100 is provided with board conveyance device 104 mounted on base 102, head unit 110 that is capable of movement in an XY plane, pickup head 120 that is detachably attached to head unit 110, mark camera 130 that images board 101 from above, part camera 132 that images an electronic component held by suction nozzle 10 from below, and component supply device 150 that supplies components to be mounted to board 101.

Board conveyance device 104 conveys board 101 from left to right using conveyor belts 108 and 108 (only one of these is shown in FIG. 1) that are respectively attached to a pair of front/rear supporting plates 106 and 106.

Head unit 110 is attached to X-axis slider 112 and moves in a left-right direction with the left-right direction movement of X-axis slider 112 along guide rails 114 and 114, and moves in a front-rear direction with the front-rear movement of Y-axis slider 116 along guide rails 118 and 118. This allows head unit 110 to move in an XY plane. Sliders 112 and 116 are each driven by a servo motor that is not shown in the figures.

Head 120 is detachably attached to head unit 110. Suction nozzle 10 uses pressure to pick up and release a component at the nozzle tip. Head 120 is a member with an approximately cylindrical exterior, and multiple (in this case, twelve) suction nozzles 10 are on the bottom of head 120. Suction nozzle 10 is integrated as one unit with nozzle holder 30 (refer to FIG. 3), which is provided in a vertical orientation. Nozzle holder 30 is covered by the covers of head 120, so is not visible in FIG. 2. Nozzle holder 30 is provided with a lever near the top end; when the lever is pressed, nozzle holder 30 is lowered together with suction nozzle 10; when the pressing of the lever is released, nozzle holder 30 and suction nozzle 10 return to their original positions by the force of a spring, which is not shown in the figures. Also, nozzle holder 30 is rotatable. Further, each suction nozzle 10 is provided with a pressure switching valve, not shown, that switches to and from supplying negative pressure or supplying atmospheric pressure to the nozzle tip.

Mark camera 130 is attached to the lower surface of X-axis slider 112. Mark camera 130 is a camera for reading marks on board 101 and the imaging region is below the camera. The marks on board 101 indicate reference positions. These reference positions are used when mounting a component held by suction nozzle 10 at a desired location on board 101.

Part camera 132 is provided at the front side of board conveyance device 104. When suction nozzle 10 holding a component passes over part camera 132, part camera 132 captures an image of the state of the component held by suction nozzle 10. The image captured by part camera 132 is used to judge whether the component is being held correctly by suction nozzle 10.

Component supply device 150 is attached to the front of component mounting device 100. Component supply device 150 has multiple slots and a feeder 152 can be inserted into each slot. Reel 154 around which tape is wound is attached to feeder 152. Components are held in the surface of the tape lined up in the lengthwise direction of the tape. The components are protected by a film that covers the surface of the tape. This tape is indexed to the rear by a sprocket mechanism which is not shown and the film is peeled off, such that the components are arranged at a predetermined position in an exposed state. The predetermined position is a position at which the component can be picked up by suction nozzle 10. A suction nozzle 10 that has picked up a component at this predetermined position is capable of mounting that component at a specified position on board 101.

Component mounting device 100 is also provided with nozzle stocker 134 and so on. Nozzle stocker 134 is a box that stocks multiple types of suction nozzles 10 and is provided next to part camera 132. Suction nozzles 10 are exchanged as appropriate for the type of component and type of board on which the component is to be mounted.

Operation of component mounting device 100 is controlled by controller 160. Controller 160 controls component mounting device 100 by receiving commands from a management computer, not shown, that manages production jobs of board 101. Defined in the production job is which components from feeders at which slot positions are to be mounted to which type of board 101 and in what order at component mounting device 100, and also how many of those boards 101 are to be manufactured and so on.

Suction nozzle 10 is described below with reference to FIGS. 3 to 5. Suction nozzle 10 is provided with nozzle main body 14, and sleeve 20 that stores nozzle main body 14 so as to be slidable along the direction in which intake passage 12 extends. Intake passage 12 is connected to a vacuum pump via a pressure switching valve, which is not shown.

Nozzle main body 14 has nozzle tip member 18 inserted into and fixed to tubular shaft member 16. Shaft member 16 is a member that fulfills the role of a wall surrounding intake passage 12, and is provided with a pair of elongated holes 16a. The pair of elongated holes 16a are formed extending lengthwise in the direction that intake passage extends, and are provided at positions of two-way symmetry around the center axis of intake passage 12. Also, shaft member 16 includes a pair of suction assistance sections 16b. The pair of suction assistance sections 16b are holes formed extending lengthwise in the direction that intake passage extends, and are provided at positions rotated 90 degrees from the pair of elongated holes 16a around the center axis of intake passage 12.

Sleeve 20 is provided with cylinder section 22, disk section 24, and pin 26. Cylinder section 22 slidably holds shaft member 16 of nozzle main body 14. Cylinder section 22 fulfills the roles of a wall surrounding intake passage 12. Disk section 24 is formed with a diameter larger than nozzle holding hole 134a (refer to FIG. 6) provided in nozzle stocker 134. Disk section 24 is formed so as to rest on the circumference surrounding nozzle holding hole 134a when the tip of suction nozzle 10 is inserted into nozzle holding hole 134a. Also, disk section 24 is provided with an engaging hole (shaft), which is not shown. When suction nozzle 10 is inserted into nozzle holding hole 134a, this engaging hole engages with a protrusion, not shown, on the circumference surrounding nozzle holding hole 134a, and thus fulfills the role of preventing suction nozzle 10 from rotating inside nozzle holding hole 134a. Pin 26 pierces cylinder section 22 in a direction perpendicular to the axis direction and is fixed to cylinder section 22 in that state. Pin 26 cuts across intake passage 12 and is inserted into the pair of elongated holes 16a provided in shaft member 16. Also, both ends of pin 26 protrude outside of sleeve 20. The pair of suction assistance sections 16b provided in shaft member 16 connect a side downstream and a side upstream of pin 26 in intake passage 12.

With suction nozzle 10 as described, when shaft member 16 of nozzle main body 14 is slid with respect to cylinder section 22 of sleeve 20 along the direction in which intake passage 12 extends, nozzle main body 14 is slid being guided by pin 26 being inserted into the pair of elongated holes 16a.

Suction nozzle 10 is removably attached to the lower side of nozzle holder 30 using both ends of pin 26, which are protruding outside. Nozzle holder 30 is configured mainly from nozzle shaft 32 that is substantially cylindrical. A pair of L-shaped cutouts 32a are formed on the lower end of nozzle shaft 32 (only one is shown in FIG. 3). Tube 34 with a diameter narrowed at the lower end, and inner spring 36 that biases tube 34 towards the nozzle tip are provided inside nozzle shaft 32. Tube 34 includes a pair of elongated holes 34a provided at positions of two-way symmetry around the center axis of intake passage 12. Pin 33 is inserted into this pair of elongated holes 34a in a direction perpendicular to the axis direction of nozzle shaft 32. Ring 35 is set on nozzle shaft 32 to prevent pin 33 from coming out. Tube 34 presses shaft member 16 of nozzle main body 14 to the nozzle tip side by the biasing force of inner spring 36. Also, when the interior of nozzle shaft 32 is slid along the direction in which intake passage 12 extends, tube 34 is slid by being guided by pin 33 being inserted into the pair of elongated holes 34a. Movable member 38 is formed in a substantially cylindrical shape and is attached around the circumference of nozzle shaft 32 so as to be slidable along the direction in which intake passage 12 extends. Flange 38a is provided on the lower end of movable member 38. Nozzle shaft 32 includes spring receiving section 32b provided slightly lower than the position at which pin 33 is inserted. Outer spring 40 is provided between spring receiving section 32b and flange 38a of movable member 38.

The attachment method of suction nozzle 10 to nozzle holder 30 is described below with reference to FIG. 6. First, nozzle holder 30 is positioned (refer to FIG. 6A) directly above the desired suction nozzle 10 that is stocked in nozzle holding hole 134a of nozzle stocker 134 (refer to FIG. 1). At this time, the vertical portions of the pair of L-shaped cutouts 32a are facing both ends of pin 26 of suction nozzle 10. Next, nozzle holder 30 is lowered and both ends of pin 26 of suction nozzle 10 are inserted into the vertical portion of L-shaped cutouts 32a (refer to FIG. 6B). At this time, pin 26 presses movable member 38 against spring receiving section 32b against the biasing force of outer spring 40. In this state, nozzle shaft 32 is rotated such that both ends of pin 26 are inserted into the horizontal portion of L-shaped cutouts 32a (refer to FIG. 6C). Then, nozzle holder 30 is raised. By this, pin 26 of suction nozzle 10 is sandwiched between the horizontal portion of L-shaped cutouts 32a and flange 38a of movable member 38 by the biasing force of outer spring 40. Note that, operation for removing suction nozzle 10 from nozzle holder 30 is the opposite of that above, so descriptions are omitted.

Next, mounting operation of components on board 101 performed based on a production job by controller 160 of component mounting device 100 is described. First, controller 160 sequentially picks up components supplied from feeders 152 using multiple suction nozzles 10 of head unit 110. Specifically, controller 160 controls X-axis slider 112 and Y-axis slider 116 to position the first suction nozzle 10 directly above the desired component. Then, controller 160 lowers the first suction nozzle 10 and supplies negative pressure to the suction nozzle 10. By this, the desired component is picked up by the first suction nozzle 10. Note that, nozzle main body 14 of suction nozzle 10 is movable in the axis direction with respect to nozzle holder 30, and is elastically held by inner spring 36, thus is able to absorb impact in the axis direction when picking up the component. After that, controller 160 raises the first suction nozzle 10 such that it returns to its original position from the lowered position. Similar operations are repeated for the subsequent suction nozzles 10. By this, components are picked up by all the suction nozzles 10, from the first to the twelfth. After that, controller 160 controls X-axis slider 112 and Y-axis slider 116 to move head unit 110 above board 101. During this movement, head holding body 21 is retracted up such that components held by suction nozzles 10 do not interfere with structural elements of component mounting device 100 or components already mounted on board 101. At the desired position above board 101, controller 160 lowers the first suction nozzle 10 and then supplies atmospheric pressure to the suction nozzle 10. By this, the component held by the first suction nozzle 10 is mounted at the desired location on board 101. Similar operations are performed for each of the components held by subsequent suction nozzles 10 such that the components are mounted on board 101.

With suction nozzle 10, suction assistance section 16b is provided within intake passage 12 and connects a side downstream of pin 26 and a side upstream of pin 26. As shown in FIG. 5, a cross section (the area of a cross section cut in a direction perpendicular to the direction in which intake passage 12 extends) of intake passage 12 is narrowed by pin 26. However, air is able to bypass pin 26 by flowing through suction assistance section 16b. Accordingly, a sufficient flow amount is maintained even in the portion of intake passage 12 where pin 26 cuts across. As a result, sufficiently large negative pressure is applied in intake passage 12. Although a sufficiently large flow amount is required to enable pickup using suction nozzle 10 of, for example, large capacity capacitors that have a relatively large weight and often have a curved (dome-shaped) pickup surface, suction nozzle 10 of the present embodiment is able to reliably pick up these types of capacitors.

According to suction nozzle 10 as described above, a sufficient flow amount is maintained even in the portion of intake passage 12 where pin 26 cuts across. As a result, sufficiently large negative pressure is applied to intake passage 12.

Also, both ends of pin 26 are used when suction nozzle 10 is made a single integrated body with nozzle holder 30, thus a relatively large force is applied to pin 26. However, because pin 26 pierces cylinder section 22 of sleeve 20, compared to a case in which the pin is joined to an outer surface of the wall, the strength is better and the risk of breaking is small.

Further, when nozzle main body 14 is slid with respect to cylinder section 22 of sleeve 20 along the direction in which intake passage 12 extends, nozzle main body 14 is slid being guided by pin 26 being inserted into the pair of elongated holes 16a, thus there is no shifting of the sliding direction.

Also, because suction assistance section 16b is an elongated hole formed in the wall of shaft member 16 of nozzle main body 14, manufacturing is easy compared to a case in which a groove is provided in shaft member 16 as the suction assistance section.

Furthermore, because the pair of suction assistance sections 16b are formed distributed in a well-balanced manner with the pair of elongated holes 16a, the strength of nozzle main body 14 is higher compared to a case in which the pair of suction assistance sections are formed in a lop-sided manner.

Meanwhile, it goes without saying that the disclosure is not limited to the above-mentioned embodiment and various embodiments may be applied within the technical scope of the disclosure.

For example, in the above embodiment, suction assistance section 16b is an elongated hole that pierces the wall of shaft member 16 of nozzle main body 14; however, the suction assistance section may be a long groove that does not pierce the wall of shaft member 16.

In the above embodiment, suction assistance section 16b is an elongated hole that pierces the wall of shaft member 16; this long hole may be provided as a surface slanted in the direction of the flow of air, such that air flows more smoothly.

In the above embodiment, suction assistance section 16b is provided as a pair, but only one, or three or greater, may be provided. Also, the pair of suction assistance sections 16b are provided at positions rotated 90 degrees from the pair of elongated holes 16a around the center axis of intake passage 12, but the positions are not limited to this, and suction assistance sections 16b may be provided at any position.

In the above embodiment, both ends of pin 26 protrude to the outside, but the configuration may be such that only one end of pin 26 protrudes to the outside. In this case, the end protruding to the outside may be used when attaching the suction nozzle to nozzle holder 30.

INDUSTRIAL APPLICABILITY

The present disclosure may be used for a suction nozzle used when mounting electronic components on a board.

REFERENCE SIGNS LIST

10: suction nozzle; 12: intake passage; 14: nozzle main body; 16: shaft member; 16a: elongated hole; 16b: suction assistance section; 18: nozzle tip member; 20: sleeve; 21: head holding body; 22: cylinder section; 24: disk section; 26: pin; 30: nozzle holder; 32: nozzle shaft; 32a: cutout; 32b: spring receiving section; 33: pin; 34: tube; 34a: elongated hole; 35: ring; 36: inner spring; 38: movable member; 38a: flange; 40: outer spring; 100: component mounting device; 101: board; 102: base; 104: board conveyance device; 106: supporting plate; 108: conveyor belt; 110: head unit; 112: X-axis slider; 114: guide rail; 116: Y-axis slider; 118: guide rail; 120: head; 130: mark camera; 132: part camera; 134: nozzle stocker; 134a: nozzle holding hole; 150: component supply device; 152: feeder; 154: reel; 160: controller; 200: suction nozzle; 202: nozzle main body; 204: sleeve; 206: elongated hole; 208: pin; 210: intake passage

The invention claimed is:

1. A suction nozzle for mounting an electronic component comprising:
   an intake passage in which negative pressure is applied such that an electronic component is picked up at a tip of the suction nozzle;
   a pin that cuts across the intake passage at a section of the intake passage; and
   a suction assistance section provided in a wall surrounding the intake passage and connecting a downstream side of the pin and an upstream side of the pin within the intake passage,
   wherein air flowing through the section of the intake passage is able to bypass the pin by flowing through the suction assistance section.

2. The suction nozzle for mounting an electronic component according to claim 1, wherein
   the pin pierces a wall surrounding the intake passage such that an end of the pin protrudes outside, and the protruding end of the pin is used when integrating the suction nozzle with a nozzle holder.

3. The suction nozzle for mounting an electronic component according to claim 1, further comprising:
   a nozzle main body including the wall that surrounds the intake passage,
   a sleeve that stores the nozzle main body so as to be slidable along a direction in which the intake passage extends, and
   a pair of elongated holes provided in the nozzle main body along the direction in which the intake passage extends,
   wherein the pin is fixed to the sleeve, cuts across the intake passage, and is inserted into the pair of elongated holes.

4. The suction nozzle for mounting an electronic component according to claim 3, wherein
   the suction assistance section is a hole provided in the nozzle main body along the direction in which the intake passage extends and different to the pair of elongated holes.

5. The suction nozzle for mounting an electronic component according to claim 3, wherein
   the suction assistance section is provided as a pair in the nozzle main body, and, when looking at a cross section of the intake passage at a section where the pin cuts across the intake passage in a direction perpendicular to the direction in which the intake passage extends, the pair of elongated holes have two-way symmetry about the center axis line of the intake passage, and the pair of suction assistance sections are provided at positions rotated by 90 degrees from the pair of elongated holes about the center axis line of the intake passage.

6. A suction nozzle for mounting an electronic component comprising:

an intake passage in which negative pressure is applied such that an electronic component is picked up at a tip of the suction nozzle;
a pin that cuts across the intake passage;
a suction assistance section provided in a wall surrounding the intake passage and connecting a downstream side of the pin and an upstream side of the pin within the intake passage;
a nozzle main body including the wall that surrounds the intake passage;
a sleeve that stores the nozzle main body so as to be slidable along a direction in which the intake passage extends; and
a pair of elongated holes provided in the nozzle main body along the direction in which the intake passage extends,
wherein the pin is fixed to the sleeve, cuts across the intake passage, and is inserted into the pair of elongated holes, and
wherein the suction assistance section is a hole provided in the nozzle main body along the direction in which the intake passage extends and different to the pair of elongated holes.

7. A suction nozzle for mounting an electronic component comprising:
an intake passage in which negative pressure is applied such that an electronic component is picked up at a tip of the suction nozzle;
a pin that cuts across the intake passage;
a suction assistance section provided in a wall surrounding the intake passage and connecting a downstream side of the pin and an upstream side of the pin within the intake passage;
a nozzle main body including the wall that surrounds the intake passage;
a sleeve that stores the nozzle main body so as to be slidable along a direction in which the intake passage extends; and
a pair of elongated holes provided in the nozzle main body along the direction in which the intake passage extends,
wherein the pin is fixed to the sleeve, cuts across the intake passage, and is inserted into the pair of elongated holes, and
wherein the suction assistance section is provided as a pair in the nozzle main body, and, when looking at a cross section of the intake passage at a section where the pin cuts across the intake passage in a direction perpendicular to the direction in which the intake passage extends, the pair of elongated holes have two-way symmetry about the center axis line of the intake passage, and the pair of suction assistance sections are provided at positions rotated by 90 degrees from the pair of elongated holes about the center axis line of the intake passage.

* * * * *